(12) United States Patent
Matsueda et al.

(10) Patent No.: US 10,263,185 B2
(45) Date of Patent: Apr. 16, 2019

(54) METHOD OF MANUFACTURING OLED DISPLAY DEVICE, MASK, AND METHOD OF DESIGNING MASK

(71) Applicant: Tianma Japan, Ltd., Kanagawa (JP)

(72) Inventors: Yojiro Matsueda, Kanagawa (JP); Kenichi Takatori, Kanagawa (JP)

(73) Assignee: TIANMA JAPAN LTD., Kanagawa (JP)

( * ) Notice: Subject to any disclaimer, the term of this patent is extended or adjusted under 35 U.S.C. 154(b) by 0 days.

(21) Appl. No.: 15/937,899

(22) Filed: Mar. 28, 2018

(65) Prior Publication Data

US 2018/0287064 A1 Oct. 4, 2018

(30) Foreign Application Priority Data

Mar. 29, 2017 (JP) .................. 2017-066366

(51) Int. Cl.
| | |
|---|---|
| *H01L 51/00* | (2006.01) |
| *H01L 51/56* | (2006.01) |
| *G06F 17/50* | (2006.01) |
| *C23C 16/24* | (2006.01) |
| *C23C 16/56* | (2006.01) |
| *C23C 14/16* | (2006.01) |
| *B05D 1/00* | (2006.01) |
| *C23C 14/04* | (2006.01) |

(Continued)

(52) U.S. Cl.
CPC .......... *H01L 51/0011* (2013.01); *B05D 1/005* (2013.01); *C23C 14/042* (2013.01); *C23C 14/165* (2013.01); *C23C 16/24* (2013.01); *C23C 16/345* (2013.01); *C23C 16/56* (2013.01); *G06F 17/5068* (2013.01); *H01L 51/001* (2013.01); *H01L 51/56* (2013.01); *H01L 27/3244* (2013.01); *H01L 2227/323* (2013.01)

(58) Field of Classification Search
None
See application file for complete search history.

(56) References Cited

U.S. PATENT DOCUMENTS

2013/0064969 A1* 3/2013 Inoue .................... C23C 14/042
427/66
2015/0380652 A1* 12/2015 Chan ................... H01L 51/0018
257/40

(Continued)

FOREIGN PATENT DOCUMENTS

JP 2004-030975 1/2004

*Primary Examiner* — Asok K Sarkar
(74) *Attorney, Agent, or Firm* — Young & Thompson

(57) ABSTRACT

A method of manufacturing an OLED display deposits an OLED material onto an electrode surface of a substrate through a mask while moving a linear source having nozzles in a first direction. The mask has holes in a surface facing the linear source. Each hole has a first opening and a larger second opening located between the first opening and the linear source. θT<90−θM and SX>D1×tan θM are satisfied. D1 is a distance from the first opening to the electrode surface. θM is the largest incident angle in the first direction of the OLED material. SX is a distance in the first direction from an edge of the first opening to an adjacent sub-pixel electrode. θT is a taper angle defined by a line connecting the edge of the first opening and the edge of the second opening and the first direction.

20 Claims, 11 Drawing Sheets

(51) Int. Cl.
*C23C 16/34* (2006.01)
*H01L 27/32* (2006.01)

(56) References Cited

U.S. PATENT DOCUMENTS

| | | | |
|---|---|---|---|
| 2016/0111680 A1* | 4/2016 | Chung | C23C 16/45544 438/28 |
| 2016/0122861 A1* | 5/2016 | Kobayashi | C23C 14/044 118/720 |
| 2017/0051394 A1* | 2/2017 | Takiguchi | H05B 33/10 |
| 2017/0121816 A1* | 5/2017 | Kim | C23C 14/34 |
| 2017/0342543 A1* | 11/2017 | Ghosh | G03F 7/707 |

* cited by examiner

METHOD OF MANUFACTURING OLED DISPLAY DEVICE, MASK, AND METHOD OF DESIGNING MASK

BACKGROUND

This disclosure relates to a method of manufacturing an OLED display device, a mask, and a method of designing the mask.

Organic light-emitting diode (OLED) elements are current-driven self-light-emitting elements. For this reason, the OLED elements are advantageous in the points such as elimination of backlight, low power consumption, wide viewing angle, and high contrast ratio, which promises the development of flat panel display devices.

There are two types of OLED display devices: one is color filter type that produces three colors of red (R), green (G), and blue (B) from white OLED elements with color filters and the other is selective deposition type in which organic light-emitting materials for the three R, G, B colors are separately applied. The color filter type has a disadvantage of high power consumption because the color filters absorb light to lower the light usage rate. In contrast, the selective deposition type has advantages of high color purity to easily produce a wide color gamut and no color filters to achieve high light usage; accordingly, the selective deposition type is widely employed.

Manufacturing the selective deposition type of OLED display device uses sheet-like metal masks (called fine metal masks (FMM)) to selectively apply organic light-emitting materials for individual colors. An organic light-emitting material is applied (vapor deposited) to form a film through openings provided in a metal mask. The metal mask deforms easily because of its structure; particularly, as the metal mask becomes thinner and larger to achieve higher definition and larger screen in the OLED display device, the metal mask deforms more easily. Hence, a problem has arisen that selectively applying organic light-emitting materials with high precision is difficult.

In order to solve the problems such as brightness defect and color mixture, JP 2004-30975 A discloses a method of designing an appropriate mask including a tolerance for the actual non-uniformity of the metal mask for organic electronic light-emitting elements.

The manufacturing an OLED display device according to JP 2004-30975 A deposits an organic light-emitting material from a fixed evaporation source onto the substrate. To deposit an organic light-emitting material in manufacturing an OLED display device, there is a known way using a linear evaporation source (also simply referred to as linear source) having linearly-disposed multiple nozzles, instead of a fixed evaporation source.

SUMMARY

An aspect of the disclosure is a method of manufacturing an OLED display device comprising: depositing an organic light-emitting material onto an electrode surface of a substrate through a mask while moving a linear source having a plurality of nozzles in a first direction. The mask has a plurality of holes in a surface facing the linear source. Each of the plurality of holes has a first opening and a second opening larger than the first opening and the second opening is located between the first opening and the linear source. Relations of $\theta T < 90 - \theta M$ and $SX > D1 \times \tan \theta M$ are satisfied, where D1 is a distance from the first opening to the electrode surface, $\theta M$ is the largest incident angle in the first direction of the organic light-emitting material, SX is a distance in the first direction from an edge of the first opening to an adjacent sub-pixel electrode, and $\theta T$ is a taper angle defined by a line connecting the edge of the first opening and the edge of the second opening and the first direction.

It is to be understood that both the foregoing general description and the following detailed description are exemplary and explanatory and are not restrictive of this disclosure.

DETAILED DESCRIPTION OF THE EMBODIMENTS

Hereinafter, an embodiment of this invention is described with reference to the accompanying drawings. It should be noted that the embodiment is merely an example to implement this invention and is not to limit the technical scope of this invention. Elements common to the drawings are denoted by the same reference signs.

<Configuration of Display Device>

Figure 1:
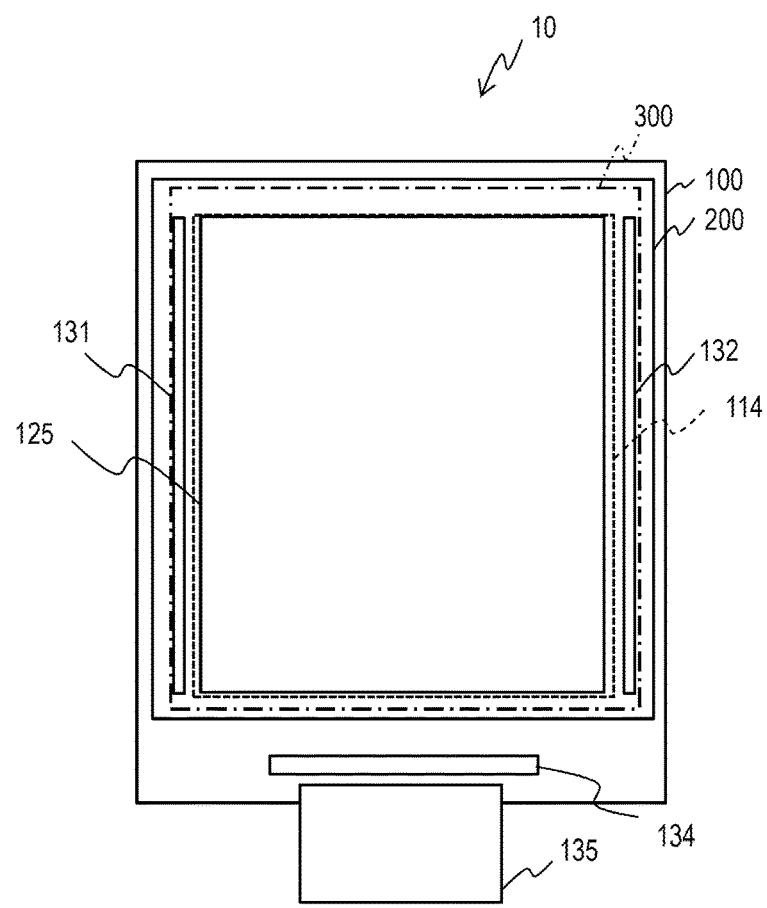
FIG. 1 schematically illustrates a configuration example of an OLED display device.
Figure 2:
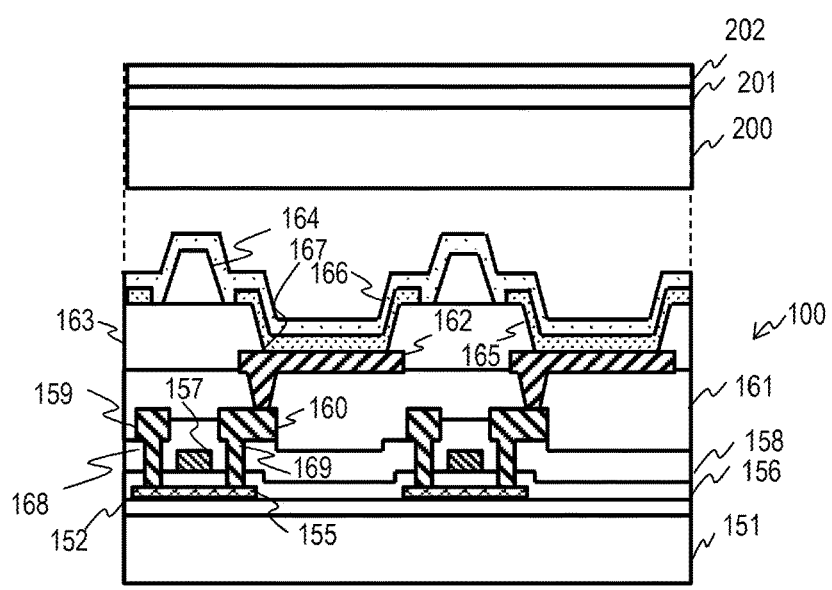
FIG. 2 schematically illustrates a part of a cross-sectional structure of the OLED display device.

With reference to FIGS. 1 and 2, an overall configuration of a display device 10 in this embodiment is described. It should be noted that the elements in the drawings may be exaggerated in size or shape for clear understanding of the description.

FIG. 1 schematically illustrates a configuration example of an organic light-emitting diode (OLED) display device 10 in this embodiment. The OLED display device 10 includes a thin film transistor (TFT) substrate 100 on which light-emitting elements are formed, an encapsulation substrate 200 for encapsulating the OLED elements, and a bond (glass frit sealer) 300 for bonding the TFT substrate 100 with the encapsulation substrate 200. The space between the TFT substrate 100 and the encapsulation substrate 200 is filled with dry air and sealed up with the bond 300.

In the periphery of a cathode electrode forming region 114 outer than the display region 125 of the TFT substrate 100, a scanning driver 131, an emission driver 132, and a driver IC 134 are provided. These are connected to the external devices via a flexible printed circuit (FPC) 135.

The scanning driver 131 drives scanning lines of the TFT substrate 100. The emission driver 132 drives emission control lines to control the emission periods of sub-pixels. The driver IC 134 can be mounted with an anisotropic conductive film (ACF).

The driver IC 134 provides power and timing signals (control signals) to the scanning driver 131 and the emission driver 132 and further, provides data voltage corresponding to image data to data lines. In other words, the driver IC 134 has a display control function.

Next, a detailed structure of the OLED display device 10 is described. FIG. 2 schematically illustrates a part of a cross-sectional structure of the OLED display device 10. The OLED display device 10 includes a TFT substrate 100 and an encapsulation substrate (transparent substrate) 200 opposed to the TFT substrate 100. FIG. 2 schematically illustrates only a part of the configuration of the TFT substrate 100. The definitions of top and bottom in the following description correspond to the top and the bottom of the drawing.

As illustrated in FIG. 2, the OLED display device 10 includes an insulating substrate 151 and an encapsulation structural unit opposed to the insulating substrate 151. An example of the encapsulation structural unit is a flexible or inflexible encapsulation substrate 200. The encapsulation structural unit can be a thin film encapsulation (TFE) structure, for example.

The OLED display device 10 includes a plurality of lower electrodes (for example, anode electrodes 162), one upper electrode (for example, a cathode electrode 166), and a plurality of organic light-emitting layers 165 disposed between the insulating substrate 151 and the encapsulation structural unit. The cathode electrode 166 is a transparent electrode that transmits the light from the organic light-emitting layers 165 toward the encapsulation structural unit.

An organic light-emitting layer 165 (also called an organic light-emitting film 165) is disposed between the cathode electrode 166 and an anode electrode 162. The plurality of anode electrodes 162 are disposed on the same plane (for example, on a planarization film 161) and an organic light-emitting layer 165 is disposed on an anode electrode 162.

The OLED display device 10 further includes a plurality of post spacers (PS) 164 standing toward the encapsulation structural unit and a plurality of circuits each including a plurality of switches. Each of the plurality of circuits is formed between the insulating substrate 151 and an anode electrode 162 and controls the electric current to be supplied to the anode electrode 162.

FIG. 2 illustrates an example of a top-emission pixel structure. The top-emission pixel structure is configured in such a manner that the cathode electrode 166 common to a plurality of pixels is provided on the light emission side (the upper side of the drawing). The cathode electrode 166 has a shape that completely covers the entirety of the display region 125. The method of manufacturing the OLED display device in this embodiment is also applicable to an OLED display device having a bottom-emission pixel structure. The bottom-emission pixel structure has a transparent anode electrode and a reflective cathode electrode to emit light to the external through the TFT substrate 100.

Hereinafter, the OLED display device 10 is described in more detail. The TFT substrate 100 includes sub-pixels (pixels) arrayed within the display region and lines provided in the wiring region surrounding the display region. The lines connect the pixel circuits with the control circuits (131, 132, 134) provided in the wiring region.

A sub-pixel displays one of the colors red, green, and blue. A red sub-pixel, a green sub-pixel, and a blue sub-pixel constitute one pixel (main pixel). A sub-pixel is composed of an OLED element and a pixel circuit including a plurality of transistors. The OLED element is composed of an anode electrode of a lower electrode, an organic light-emitting layer, and a cathode electrode of an upper electrode. A plurality of OLED elements are formed of one cathode electrode 166, a plurality of anode electrodes 162, and a plurality of organic light-emitting layers 165.

The insulating substrate 151 is made of glass or resin, for example, and is flexible or inflexible. In the following description, the side closer to the insulating substrate 151 is defined as lower side and the side farther from the insulating substrate 151 is defined as upper side. Gate electrodes 157 are provided with a gate insulating film 156 interposed. An interlayer insulating film 158 is provided over the gate electrodes 157.

Within the display region 125, source electrodes 159 and drain electrodes 160 are provided above the interlayer insulating film 158. The source electrodes 159 and the drain electrodes are formed of a metal having a high melting point or an alloy of such a metal. Each source electrode 159 and each drain electrode 160 are connected with a channel 155 through contacts 168 and 169 provided in contact holes of the interlayer insulating film 158.

Over the source electrodes 159 and the drain electrodes 160, an insulative planarization film 161 is provided. Above the insulative planarization film 161, anode electrodes 162 are provided. Each anode electrode 162 is connected with a drain electrode 160 through a contact provided in a contact hole in the planarization film 161. The pixel circuits (TFTs) are formed below the anode electrodes 162.

Above the anode electrodes 162, an insulative pixel defining layer (PDL) 163 is provided to separate OLED elements. An OLED element is composed of an anode electrode 162, an organic light-emitting layer 165, and the cathode electrode 166 (a part thereof) laminated together. The OLED element is formed in an opening 167 of the pixel defining layer 163.

Each insulative post spacer 164 is provided on the pixel defining layer 163 between anode electrodes 162. The top face of the post spacer 164 is located higher than the top face of the pixel defining layer 163 or closer to the encapsulation substrate 200 and maintains the space between the OLED elements and the encapsulation substrate 200 by supporting the encapsulation substrate 200 when the encapsulation substrate 200 is deformed.

Above each anode electrode 162, an organic light-emitting layer 165 is provided. The organic light-emitting layer 165 is in contact with the pixel defining layer 163 in the opening 167 of the pixel defining layer 163 and its periphery. A cathode electrode 166 is provided over the organic light-emitting layer 165. The cathode electrode 166 is a transparent electrode. The cathode electrode 166 transmits all or part of the visible light from the organic light-emitting layer 165.

The laminated film of the anode electrode 162, the organic light-emitting layer 165, and the cathode electrode 166 formed in an opening 167 of the pixel defining layer 163 corresponds to an OLED element. The cathode electrode 166 is common to the anode electrodes 162 and the organic light-emitting layers 165 (OLED elements) that are formed separately. A not-shown cap layer may be provided over the cathode electrode 166.

The encapsulation substrate 200 is a transparent insulating substrate, which can be made of glass. A λ/4 phase difference plate 201 and a polarizing plate 202 are provided over the light emission surface (top face) of the encapsulation substrate 200 to prevent reflection of light entering from the external.

<Manufacturing Method>

An example of the method of manufacturing the OLED display device 10 is described. As will be described later, this disclosure is characterized by the deposition of an organic light-emitting layer 165. As far as the deposition of an organic light-emitting layer 165 in this embodiment can be applied, the other steps are optional. In the following description, the elements formed in the same process (simultaneously) are the elements on the same layer.

The method of manufacturing the OLED display device 10 first deposits silicon nitride, for example, onto the insulating substrate 151 by chemical vapor deposition (CVD) to form a first insulating film 152. Next, the method forms a layer (poly-silicon layer) including channels 155 by a known low-temperature poly-silicon TFT fabrication technique. For example, the method can form the poly-silicon layer by depositing amorphous silicon by CVD and crystallizing the amorphous silicon by excimer laser annealing (ELA). The poly-silicon layer is used to connect elements within the display region 125.

Next, the method deposits silicon oxide, for example, onto the poly-silicon layer including the channels 155 by CVD to form a gate insulating film 156. Furthermore, the method deposits a metal by sputtering and patterns the metal to form a metal layer including gate electrodes 157.

The metal layer includes storage capacitance electrodes, scanning lines, emission control lines, and power lines, in addition to the gate electrodes 157. The metal layer may be a single layer made of one material selected from a group consisting of Mo, W, Nb, MoW, MoNb, Al, Nd, Ti, Cu, a Cu alloy, an Al alloy, Ag, and an Ag alloy. Alternatively, the metal layer may be a laminated layer to reduce the wiring resistance. The laminated layer has a multi-layer structure including two or more layers each made of a low-resistive material such as Mo, Cu, Al, Ag, or an alloy thereof.

Next, the method dopes additional impurities to the channels 155 doped with high-concentration impurities before formation of the gate electrodes 157 using the gate electrodes 157 as a mask. As a result, a layer of low-concentration impurities is formed and the TFTs are provided with lightly doped drain (LDD) structure. Next, the method deposits silicon oxide by CVD to form an interlayer insulating film 158.

The method opens contact holes in the interlayer insulating film 158 and the gate insulating film 156 by anisotropic etching. The contact holes for the contacts 168 and 169 to connect the source electrodes 159 and the drain electrodes 160 to the channels 155 are formed in the interlayer insulating film 158 and the gate insulating film 156.

Next, the method deposits an aluminum alloy such as Ti/Al/Ti by sputtering and patterns the alloy to form a metal layer. The metal layer includes source electrodes 159, drain electrodes 160, and contacts 168 and 169. In addition to these, data lines and power lines are also formed.

Next, the method deposits a photosensitive organic material to form a planarization film 161. Subsequently, the method opens contact holes for connecting to the source electrodes 159 and the drain electrodes 160 of the TFTs. The method forms anode electrodes 162 on the planarization film 161 having contact holes. An anode electrode 162 includes three layers of a transparent film made of ITO, IZO, ZnO, $In_2O_3$, or the like, a reflective film made of Ag, Mg, Al, Pt, Pd, Au, Ni, Nd, Ir, Cr, or a metallic compound thereof, and another transparent film as mentioned above. The three-layer structure of the anode electrode 162 is merely an example and the anode electrode 162 may have a two-layer structure. The anode electrodes 162 are connected to the drain electrodes 160 through contacts.

Next, the method deposits a photosensitive organic resin by spin coating and patterns the photosensitive organic resin to form a pixel defining layer 163. The patterning creates holes in the pixel defining layer 163 to expose the anode electrodes 162 of the sub-pixels at the bottom of the created holes. The side walls of the holes in the pixel defining layer 163 are normally tapered. The pixel defining layer 163 forms separate light-emitting regions of sub-pixels. The method further deposits a photosensitive organic resin by spin coating and patterns the photosensitive organic resin to form post spacers 164 on the pixel defining layer 163.

Next, the method applies organic light-emitting materials onto the insulating substrate 151 provided with the pixel defining layer 163 to form organic light-emitting layers 165. An organic light-emitting layer 165 is formed by depositing an organic light-emitting material for the color of R, G, or B on each anode electrode 162. The forming an organic light-emitting layer 165 uses a metal mask (MM).

The metal mask is prepared for the pattern of the sub-pixels of a specific color and a plurality of metal masks are prepared for different colors. The method places and attaches the metal mask onto the surface of the TFT substrate 100 in correct alignment. The method evaporates an organic light-emitting material to be deposited onto the places corresponding to the sub-pixels on the TFT substrate 100 through the openings of the metal mask. The details of the metal mask and the deposition using the metal mask will be described later.

The organic light-emitting layer 165 consists of, for example, a hole injection layer, a hole transport layer, a light-emitting layer, an electron transport layer, and an electron injection layer in this order from the bottom. The organic light-emitting layer 165 may have any structure selected from the structures of electron transport layer/light-emitting layer/hole transport layer, electron transport layer/light-emitting layer/hole transport layer/hole injection layer, electron injection layer/electron transport layer/light-emitting layer/hole transport layer, and mono-light-emitting layer. Another layer such as electron blocking layer may be added. The materials of the light-emitting layers are different depending on the color of the sub-pixel; the film thicknesses of the hole injection layer and the hole transport layer are controlled depending on the color, as necessary.

Next, the method applies a metal material for the cathode electrode 166 onto the TFT substrate 100 where the pixel defining layer 163, the post spacers 164, and the organic light-emitting layers 165 (in the openings of the pixel defining layer 163) are exposed. The metal material adheres to the pixel defining layer 163, the post spacers 164 and the organic light-emitting layers 165. The metal material vapor deposited on the organic light-emitting layer 165 of one sub-pixel functions as the cathode electrode 166 of the sub-pixel.

The layer of the transparent cathode electrode 166 is formed by vapor-deposition of Li, Ca, LiF/Ca, LiF/Al, Al, Mg, or an alloy thereof, for example. The film thickness of the cathode electrode 166 is optimized to increase the light-extraction efficiency and ensure better view angle dependence. If the resistance of the cathode electrode 166 is so high to impair the uniformity of the luminance of the emitted light, an additional auxiliary electrode layer may be formed using a material for a transparent electrode, such as ITO, IZO, ZnO, or $In_2O_3$. To increase the light extraction efficiency, a cap layer may be formed by depositing an insulator having a refractive index higher than glass, after forming the cathode electrode 166.

Through the foregoing processes, OLED elements corresponding to R, G, and B sub-pixels are formed; the regions where the anode electrodes 162 are in contact with the organic light-emitting layers 165 (in the openings in the pixel defining layer 163) become R light-emitting regions, G light-emitting regions, and B light-emitting regions.

Next, the method applies glass frit to the periphery of the TFT substrate 100, places an encapsulation substrate 200 thereon, and heats and melts the glass frit with a laser beam to seal the TFT substrate 100 and the encapsulation substrate 200. Thereafter, the method forms a λ/4 phase difference plate 201 and a polarizing plate 202 on the light emission side of the encapsulation substrate 200 to complete the fabrication of the OLED display device 10.

Hereinafter, the details of the deposition of an organic light-emitting layer are described. The manufacturing system for the OLED display device 10 selectively deposits organic light-emitting materials with metal masks. The manufacturing system sets metal masks having openings a little larger than light-emitting regions on the TFT substrate 100 in correct alignment one after another to selectively deposit the organic light-emitting materials for individual colors. Since the electric current flows only within the openings of the pixel defining layer 163, these regions become light-emitting regions.

Figure 3A:
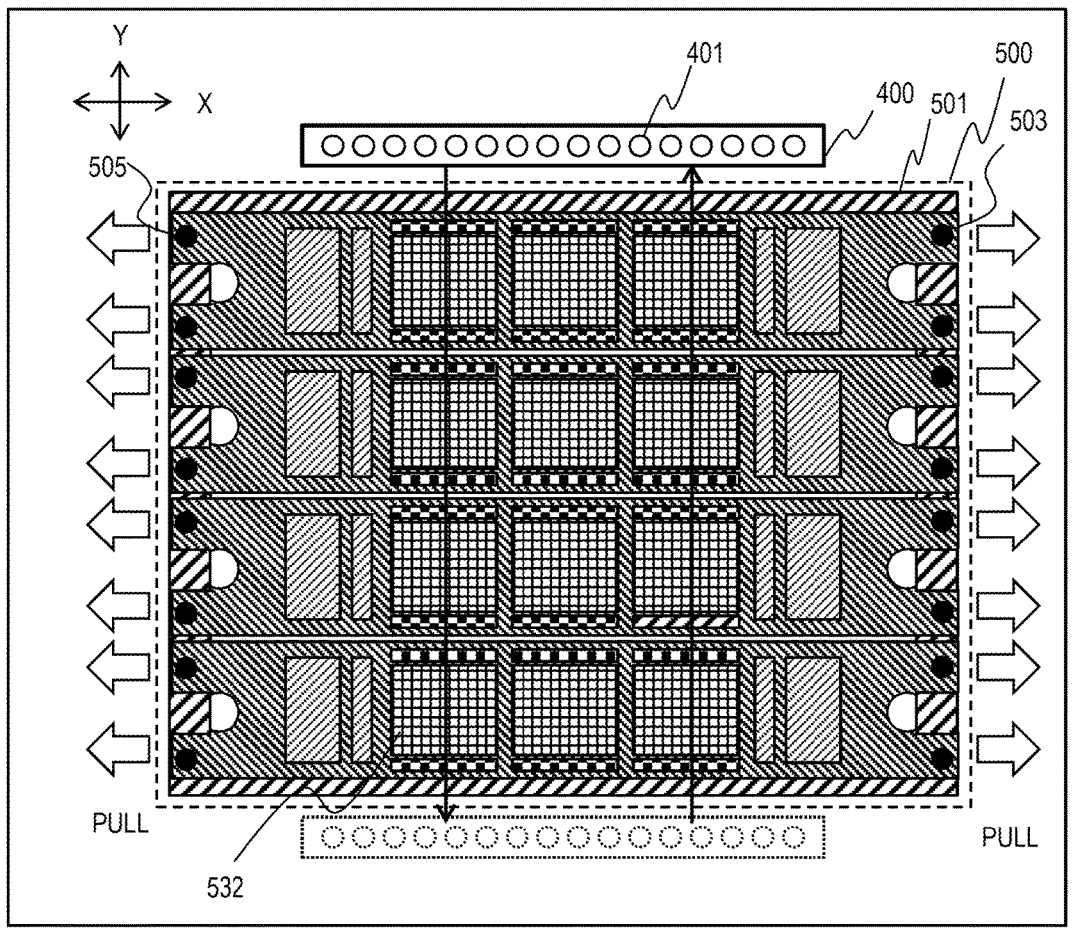
FIG. 3A schematically illustrates a configuration example of a metal mask module and a linear source to be used for deposition of an organic light-emitting layer.

FIG. 3A schematically illustrates a configuration example of a metal mask module 500 and a linear source 400 to be used for deposition of an organic light-emitting layer. The metal mask module 500 is used to deposit an organic light-emitting material onto a motherboard including the panels for a plurality of OLED display devices. The panel for each OLED display device is cut out from the motherboard.

The metal mask module 500 includes a frame 501 and a plurality of strip-like metal masks 503. For example, the frame 501 has a rectangular shape and consists of parts corresponding to the four sides to surround a central opening. The frame 501 is structured to have sufficient stiffness and small thermal deformability to hold stretched metal masks 503 with high precision. To achieve small thermal deformation, the frame 501 is formed of Invar, for example. The shape and the material of the frame 501 depends on the design.

In FIG. 3A, each of the plurality of metal masks 503 is secured to the frame 501 in the state where the metal mask 503 is stretched longitudinally (along the X-axis). Each metal mask 503 is secured to the frame 501 at the fixing points 505 on the four corners. When the metal mask 503 is secured to the frame 501, the metal mask 501 is being pulled in the longitudinal direction (along the X-axis). The tension reduces the deformation of the metal mask 503. The metal mask 503 can be made of nickel, a nickel alloy, or a nickel-cobalt alloy, for example. The material of the metal mask 503 depends on the design.

A plurality of metal masks 503, four metal masks in FIG. 3A, are disposed along the axis (the Y-axis) perpendicular to the direction of pull (the X-axis direction). The number of the metal masks 503 can be any, but not less than one.

Each metal mask 503 has a plurality of mask patterns 532. In the example of FIG. 3A, each metal mask 503 has three mask patterns 532 disposed along the longitudinal axis (the X-axis). One mask pattern 532 corresponds to the pattern of one kind of sub-pixels in the active area of one OLED display device 10. The number of mask patterns 532 in one metal mask 503 can be any, but not less than one.

The linear source 400 has multiple nozzles 401 disposed linearly along the longitudinal axis (the X-axis). The linear source 400 moves back and forth along the axis (the Y-axis) perpendicular to the disposition of the nozzles 401 over the metal mask module 500 to deposit the organic light-emitting material onto the motherboard.

The direction of movement of the linear source 400 (the Y-axis direction) is perpendicular to the direction of pulling the metal mask 503 (the X-axis direction). In the alignment of the metal mask 503, the error is large in the direction of pull (the X-axis direction) and small in the direction perpendicular thereto (the Y-axis direction). Accordingly, the linear source 400 moves perpendicularly to the direction of pull (moves along the Y-axis). All the mask patterns 532 of each metal mask 503 are provided between the nozzles on the both ends in the X-axis direction. The linear source 400 moves along the Y-axis to deposit the organic light-emitting material onto the motherboard through the entire mask patterns 532.

Figure 3B:
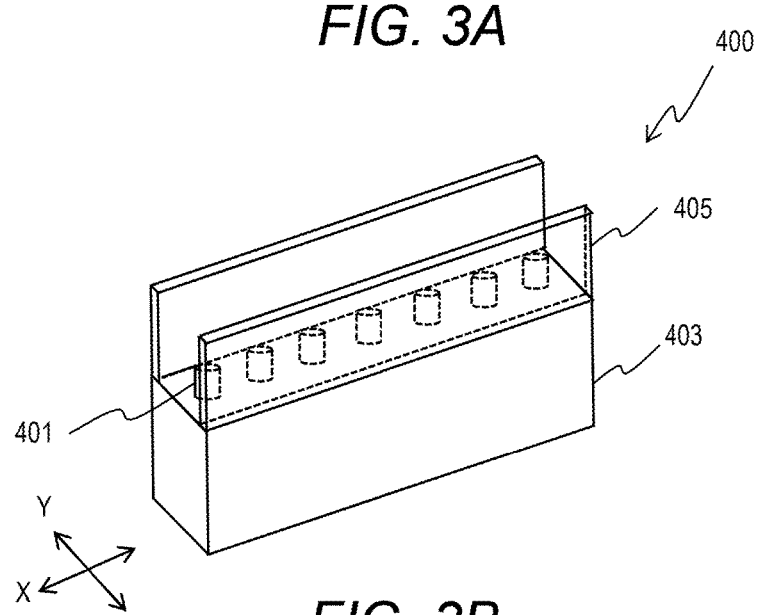
FIG. 3B schematically illustrates a configuration example of the linear source.

FIG. 3B schematically illustrates a configuration example of the linear source 400. The orientations of the X-axis and the Y-axis in FIG. 3B are the same as those in FIG. 3A. The linear source 400 includes a plurality of nozzles 401, a body 403, and two walls 405. In FIG. 3B, only one of the nozzles is provided with a reference sign 401 and only one of the walls is provided with a reference sign 405.

The body 403 has an internal space for containing an organic light-emitting material. The linear source 400 is heated to vaporize the organic light-emitting material contained in the body 403 and eject the organic light-emitting material from the ejection openings of the nozzles 401 toward the metal mask module 500.

The plurality of nozzles 401 are disposed linearly along the longitudinal axis (the X-axis) on the body 403. The plurality of nozzles 401 are disposed at specific intervals. The disposition pitch of the nozzles 401 can be uniform or varied.

When the linear source 400 is moving for deposition, the plurality of nozzles 401 (the ejection openings thereof) and the surface of the body 403 with the nozzles 401 face the metal mask module 500. The plurality of nozzles 401 are projected toward the metal mask module 500. Each nozzle 401 (the ejection opening thereof) is oriented at a specific angle with respect to the normal to the metal mask 503 in a direction of movement of the linear source 400 (a Y-axis direction).

At least a part of the nozzles 401 have different angles from one another in a direction of movement of the linear source 400 (a Y-axis direction). Some nozzle 401 may be inclined in a direction of the Y-axis and some other nozzle 401 may be inclined in the other direction of the Y-axis. In the example of FIG. 3A, some nozzle 401 may be inclined upward of the sheet and some other nozzle 401 may be inclined downward of the sheet.

A part of the nozzles 401 may be oriented in the direction of the normal to the metal mask 503. None of the nozzles 401 have to be inclined in either direction of the Y-axis. In an X-axis direction, all the nozzles 401 may be oriented in the direction of the normal to the metal mask 503 or some of the nozzles 401 may be oriented at different angles.

The two walls 405 are provided to sandwich the plurality of linearly disposed nozzles 401 in the direction of movement of the linear source 400 (Y-axis direction). Each wall 405 stands from the body 403 toward the metal mask module 500 and extends along the X-axis. In the example of FIG. 3B, the two walls 405 are parallel and their heights are the same. The shapes and the sizes of the two walls 405 depend on the design. The orientations of the nozzles 401 and the heights of the walls 405 are designed so that the organic light-emitting material ejected at uniform pressure will be vapor deposited uniformly within a plane.

The orientation of a nozzle 401 and the height of the walls 405 define the incident angle of the organic light-emitting material ejected from the nozzle 401 on the metal mask 503 and the motherboard. Each wall 405 defines the upper limit of the ejection angle of the organic light-emitting material or the upper limit of the incident angle in a Y-axis direction on the metal mask 503 and the motherboard. The incident angle of the organic light-emitting material will be described later in detail.

Figure 3C:
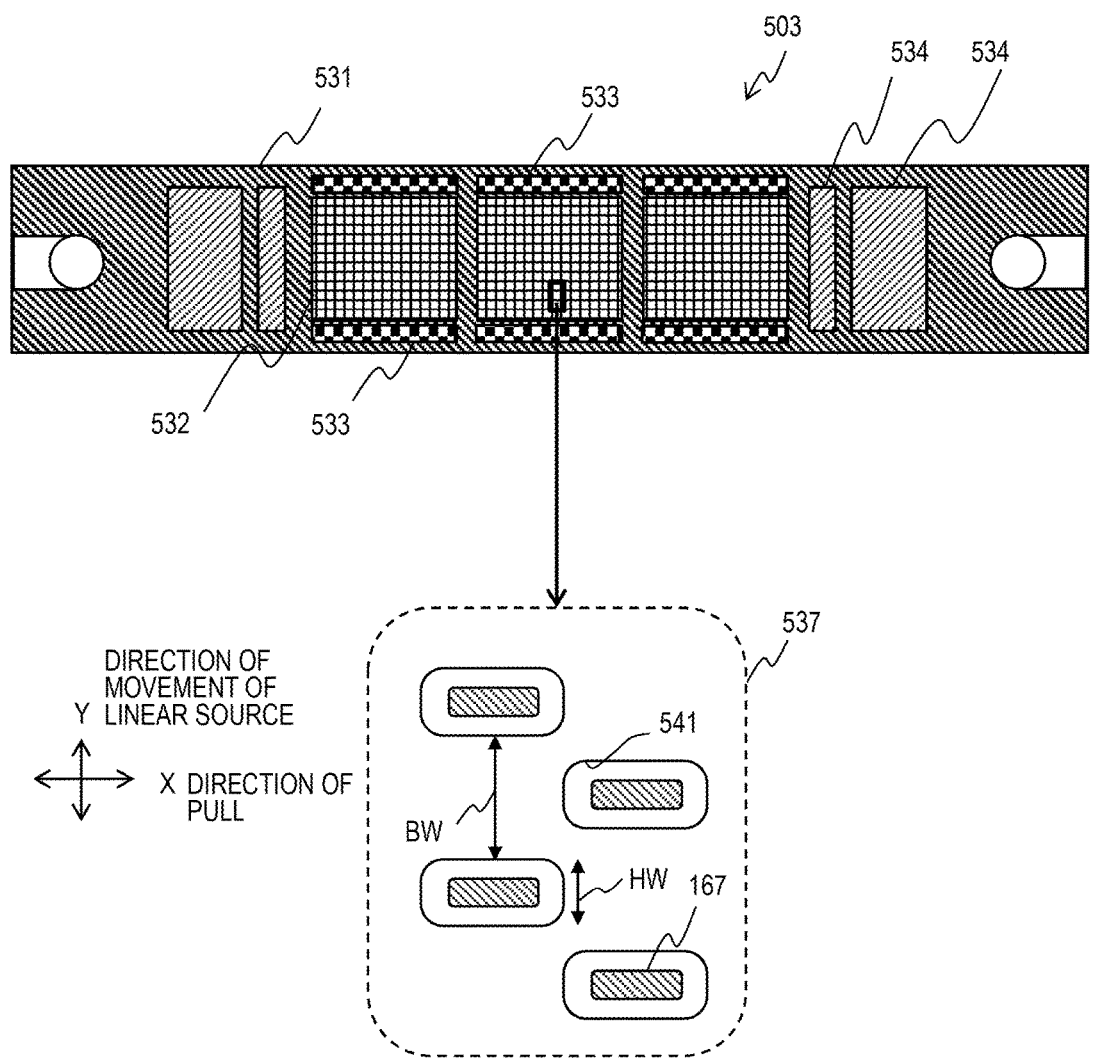
FIG. 3C schematically illustrates a configuration example of a metal mask.

FIG. 3C schematically illustrates a configuration example of a metal mask 503. The orientations of the X-axis and the Y-axis in FIG. 3C are the same as those in FIG. 3A. The metal mask 503 has a substantially rectangular shape; the metal mask 503 is pulled in the longitudinal direction (along the X-axis) and secured to the frame 501. The metal mask 503 includes a substrate body 531 and multiple mask patterns 532 disposed along the longitudinal axis (the X-axis). In the example of FIG. 3C, three mask patterns 532 are provided.

Each mask pattern 532 is an opening pattern for the active area of one OLED display device 10. The mask pattern 532 corresponds to the pattern of the R, G, or B sub-pixels in the active area. The mask pattern 532 is composed of openings provided in accordance with the pixel array and a masking part surrounding the openings. Each opening corresponds to a sub-pixel; the organic light-emitting material that passes through the opening adheres to the anode electrode 162 of the corresponding sub-pixel.

The metal mask 503 further includes a plurality of dummy patterns 533 and a plurality of half-etched regions 534. In FIG. 3C, only two of the six dummy patterns are provided with a reference sign 533 by way of example. Each pair of the three pairs of dummy patterns 533 are provided to sandwich a mask pattern 532 in the Y-axis direction.

In FIG. 3C, only two of the four half-etched regions are provided with a reference sign 534 by way of example. The half-etched regions 534 are formed to sandwich the mask patterns 532 in the X-axis direction. Two half-etched regions 534 are formed on one side and the other two half-etched regions 534 are formed on the other side. The dummy patterns 533 and the half-etched regions 534 are formed so that the metal mask 503 is stretched uniformly in response to pulling. Whether to provide the dummy patterns 533 and the half-etched regions 534, and the numbers, the locations, and the shapes of the dummy patterns 533 and the half-etched regions 534 are optional depending on the design.

The region 537 is an enlarged view of a part of a mask pattern 532. First openings 541 (hereinafter, also referred to as openings 541) are formed regularly to correspond to the sub-pixel array. The anode electrodes 162 of the sub-pixels are exposed from the openings 541. The organic light-emitting material passes through the openings 541 and adheres to the anode electrodes 162. As will be described later, the size and the pitch of the openings 541 in the direction of movement of the linear source 400 (the Y-axis direction) are significant for this embodiment.

In this embodiment, the dimension of an opening 541 in the direction of movement of the linear source (the Y-axis direction) is referred to as opening width HW. The masking part between openings 541 adjacent to each other in the direction of movement of the linear source (the Y-axis direction) is referred to as bridge. The dimension of the bridge in the direction of movement of the linear source (the Y-axis direction) is referred to as bridge width BW. The bridge width BW is the shortest distance between the edges of two openings 541 adjacent to each other in the direction of movement of the linear source (the Y-axis direction). In a mask pattern 532 in this example, the opening widths HW of the openings 541 are equal and the bridge widths BW of the bridges are equal.

The metal mask 503 of this disclosure is applicable to various pixel arrays such as the stripe array, the mosaic array, and the pentile array. The shape of the opening 541 is determined by the design and can be a rectangle or a shape other than a rectangle.

Figure 4A:
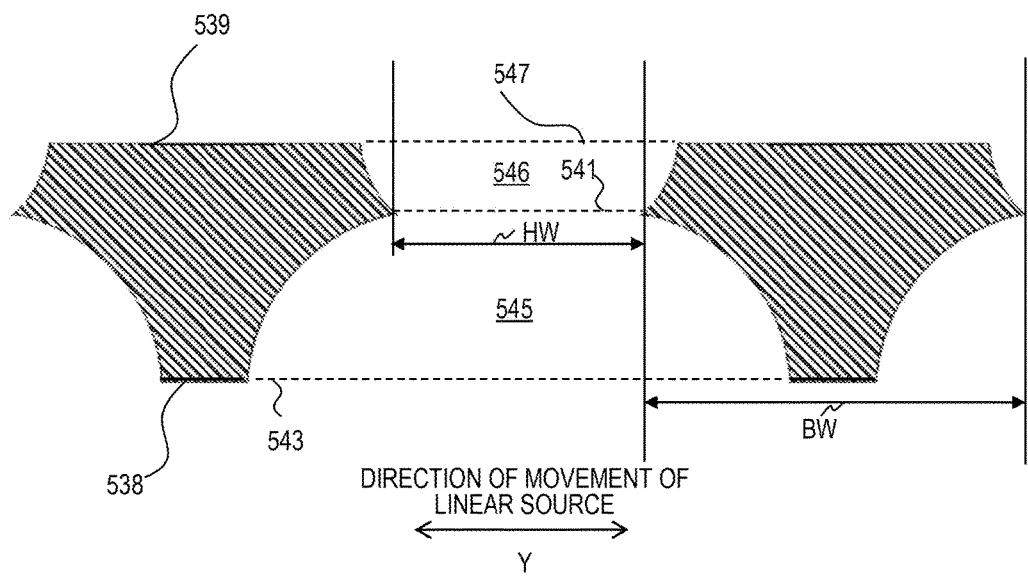
FIG. 4A is a cross-sectional diagram of a part of a mask pattern.

FIG. 4A is a cross-sectional diagram of a part of a mask pattern 532. Although not shown in FIG. 4A, the motherboard is placed above the mask pattern 532 and the linear source 400 passes under the mask pattern 532. As described with reference to FIG. 3C, the mask pattern 532 has a plurality of openings 541 provided correspondingly to the sub-pixel array. Hereinafter, the opening 541 is also referred to as nominal opening. As will be described later, each nominal opening 541 defines an area of a sub-pixel to which the organic light-emitting material is vapor deposited.

The nominal opening 541 is the boundary between a linear-source-side hole (space) 545 and a motherboard-side hole (space) 546 (also referred to as second hole 546). The linear-source-side hole 545 can be formed by wet etching the linear-source-side surface 538 of the mask pattern 532. The linear-source-side hole 545 has a second opening 543 on the linear source side or the opposite side of the nominal opening 541. Hereinafter, the second opening 543 is also referred to as linear-source-side opening 543. The linear-source-side opening 543 is on the same plane as the linear-source-side surface 538. The linear-source-side surface 538 is the surface to face the linear source 400.

The motherboard-side hole 546 can be formed by wet etching the motherboard-side surface 539 of the mask pattern 532. The motherboard-side surface 539 is the surface to face the motherboard that is to be processed by deposition. The motherboard-side hole 546 has a third opening 547 on the motherboard side or the opposite side of the nominal opening 541. Hereinafter, the third opening 547 is also referred to as motherboard-side opening 547. The motherboard-side opening 547 is on the same plane as the motherboard-side surface 539.

The inner surfaces of the linear-source-side hole 545 and the motherboard-side hole 546 are concaved. The width of the linear-source-side hole 545 in the direction of movement of the linear source (the Y-axis direction) decreases from the linear-source-side opening 543 toward the nominal opening 541. The width of the motherboard-side hole 546 in the direction of movement of the linear source (the Y-axis direction) decreases from the motherboard-side opening 547 toward the nominal opening 541.

Forming the linear-source-side hole 545 and the motherboard-side hole 546 from both sides of the mask pattern 532 enables the nominal opening 541 to precisely have a desired size.

As described with reference to FIG. 3C, the opening width HW of the nominal opening 541 is defined in the direction of movement of the linear source (the Y-axis direction) and the bridge width BW is defined between the edges of two nominal openings 541 adjacent to each other in the direction of movement of the linear source (the Y-axis direction).

Figure 4B:
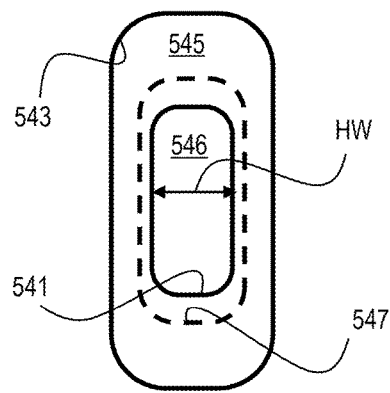
FIG. 4B illustrates a relation of three openings when viewed in the direction of the normal to the mask pattern.

FIG. 4B illustrates a relation of the three openings 541, 543, and 547 when viewed in the direction of the normal to the mask pattern 532. The nominal opening 541 is smaller than the linear-source-side opening 543 and the motherboard-side opening 547 and included in these openings. In this example, the linear-source-side opening 543 is the largest; however, the largest can be the motherboard-side opening 547. The motherboard-side opening 547 can be omitted so that the nominal opening 541 is formed on the same plane as the motherboard-side surface 539 (that is, at the location of the motherboard-side opening 547).

Figure 5:
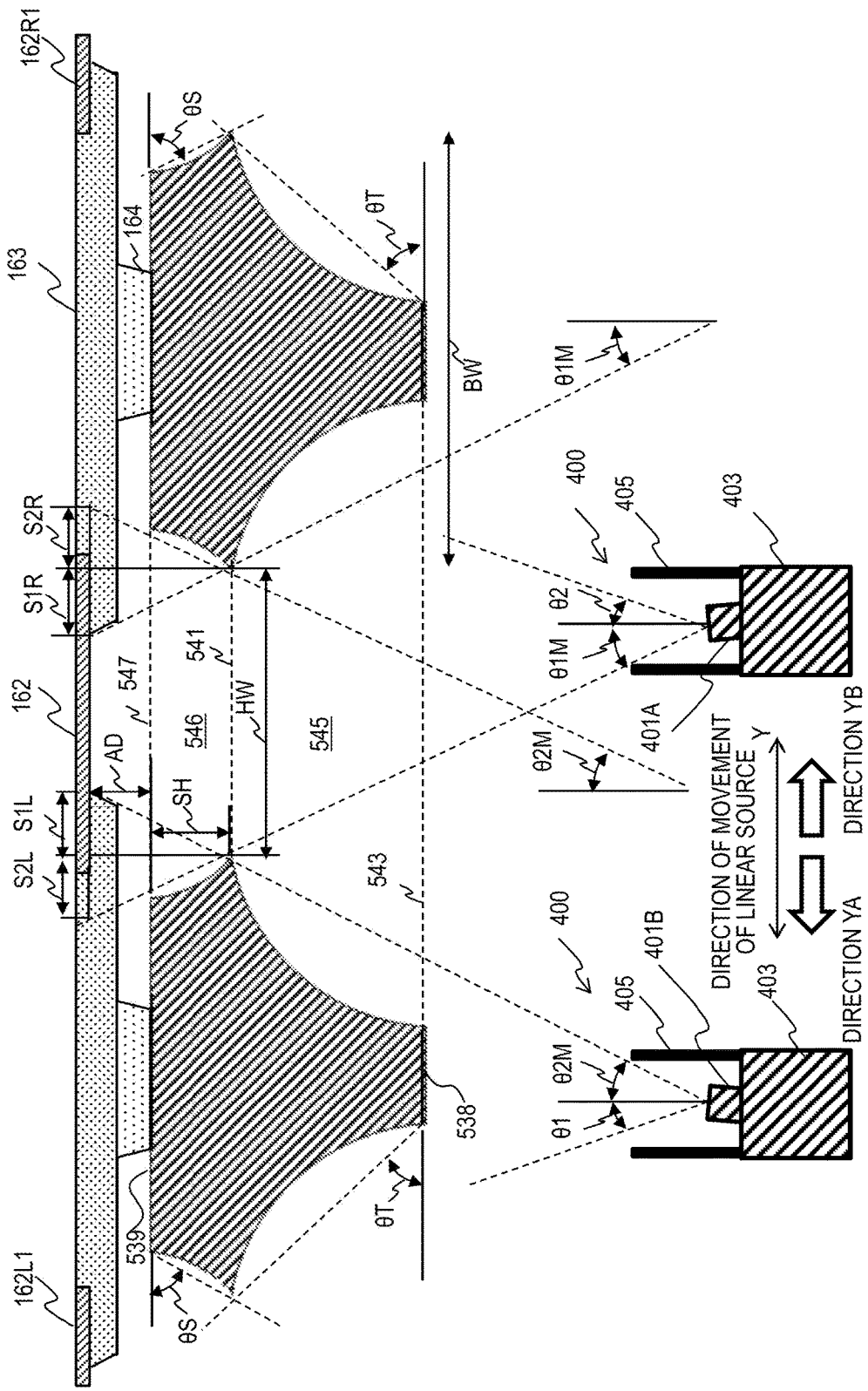
FIG. 5 illustrates a linear source at different positions and further illustrates two nozzles of the linear source at the different positions.
Figure 6:
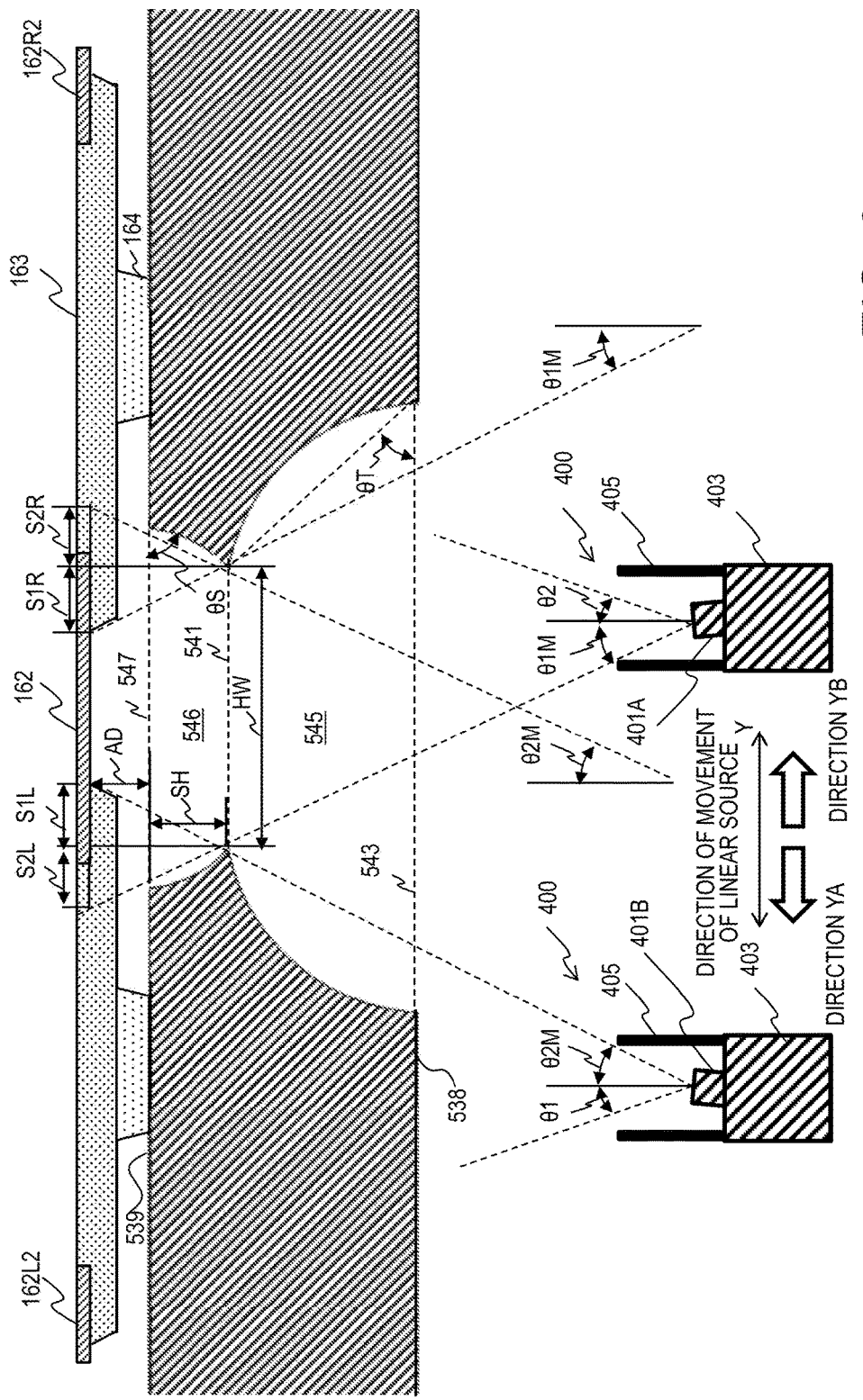
FIG. 6 illustrates a linear source at different positions and further illustrates two nozzles of the linear source at the different positions.

FIGS. 5 and 6 are the first and the second diagram for schematically illustrating the relation of the moving linear source 400, the mask pattern 532, and the motherboard. FIGS. 5 and 6 provide a cross-section along the Y-axis perpendicular to the longitudinal axis (the X-axis) of the linear source 400. In FIG. 5 and the later-described FIG. 7, the anode electrode 162 and the anode electrodes 162R1 and 162L1 adjacent to the anode electrode 162 are assumed to be the anode electrodes included in sub-pixels for the same color.

Figure 8:
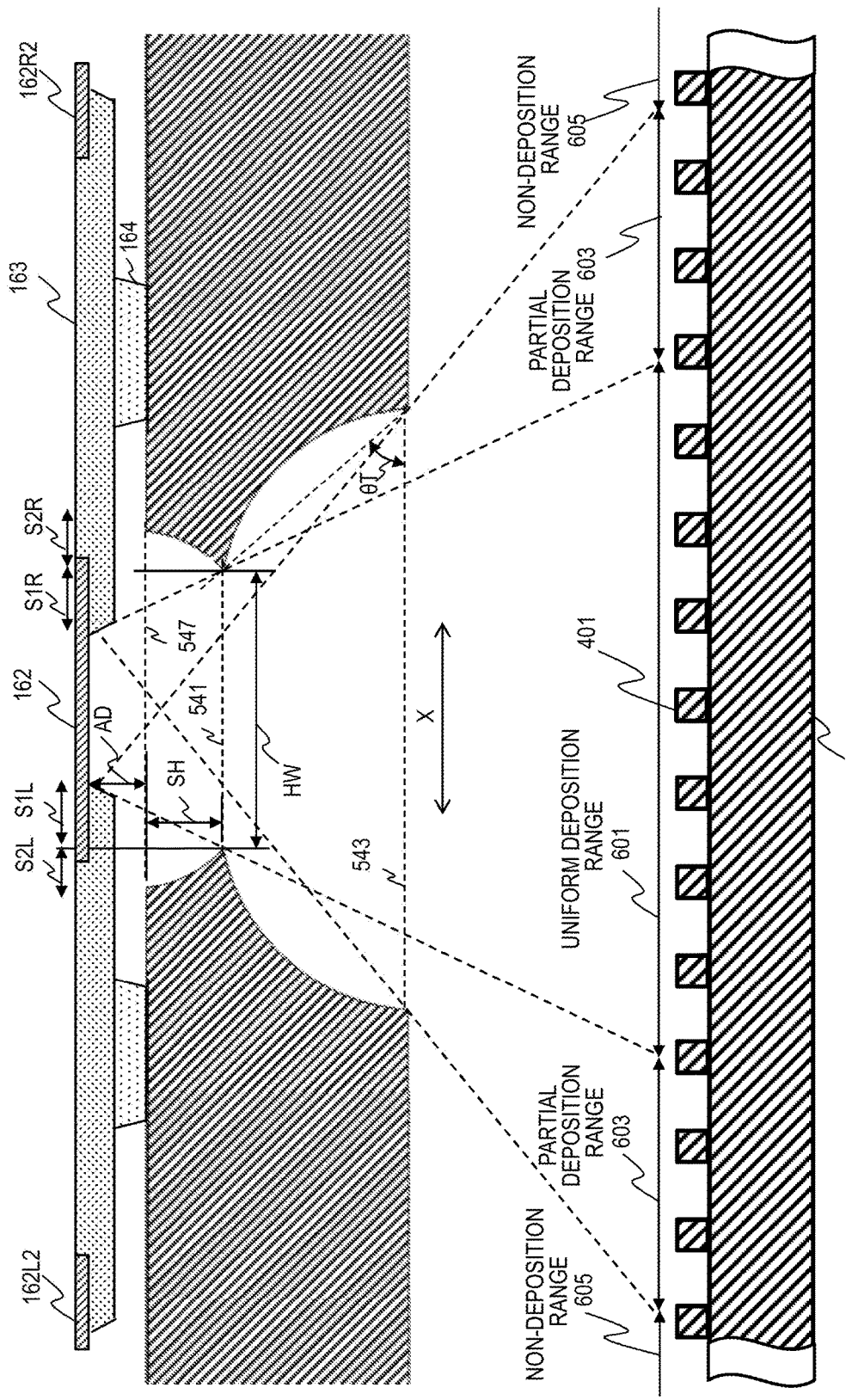
FIG. 8 schematically illustrates a relation of a linear source, a mask pattern, and a motherboard.

In FIG. 6 and later-described FIG. 8, the anode electrode 162 is assumed to be the anode electrode of a sub-pixel for a color different from the colors of the sub-pixels including the adjacent anode electrodes 162R2 and 162L2. In the examples of FIGS. 6 and 8, if the anode electrode 162 is the anode electrode included in a blue sub-pixel, the anode electrodes 162R2 and 162L2 are the anode electrodes included in red sub-pixels.

Alternatively, if the anode electrode 162 is the anode electrode included in a blue sub-pixel, the anode electrodes 162R2 and 162L2 can be the anode electrodes included in a red sub-pixel and a green sub-pixel. Hereinafter, the mask in this embodiment is described in detail with reference to mainly FIGS. 5 and 6.

The mask pattern 532 (mask 503) is in contact with the motherboard. The motherboard includes anode electrodes and a pixel defining layer for insulating the anode electrodes. More specifically, the motherboard-side surface 539 is in contact with the top surfaces of the post spacers 164. The surface of the anode electrode 162 is exposed from an opening of the pixel defining layer 163. The surface of the anode electrode 162 and the pixel defining layer 163 surrounding the anode electrode 162 are exposed from a nominal opening 541. The organic light-emitting material for the first color or the organic light-emitting material for the sub-pixel including the anode electrode 162 adheres to the surface of the anode electrode 162 and the pixel defining layer 163 surrounding the anode electrode 162.

In FIG. 6, since the colors for the sub-pixels including the anode electrodes 162R2 and 162L2 are different from the color for the sub-pixel including the anode electrode 162, the surfaces of the anode electrodes 162R2 and 162L2 are not exposed so that the organic light-emitting material for the sub-pixel including the anode electrode 162 does not adhere to the surfaces of the anode electrodes 162R2 and 162L2.

FIGS. 5 and 6 each include the same linear source 400 at different positions and further include nozzles 401A and 401B of the linear source 400 at the different positions. In FIGS. 5 and 6, the Y-axis direction toward the left is referred to as direction YA and the Y-axis direction toward the right is referred to as direction YB. Each nozzle 401 of the linear source 400 is inclined in a direction of movement of the linear source (a Y-axis direction) by a specific angle.

The nozzle 401A is inclined in the direction YA at the largest inclination angle among the nozzles 401 in the linear source 400. The organic light-emitting material ejected from the nozzle 401A travels toward the mask pattern 532 and the motherboard at a specific diffusion angle. The largest incident angles of the organic light-emitting material ejected from the nozzle 401A on the motherboard is θ1M in the direction YA and θ2 in the direction YB. The incident angle on the motherboard is the angle between the normal to the deposition surface (main surface) of the motherboard and the incident direction of the organic light-emitting material. In this example, the incident angle on the mask pattern 532 is the same as the incident angle on the motherboard.

The incident angle θ1M is the largest incident angle in the direction YA available from the linear source 400. In this example, the incident angle θ1M is defined by a wall 405. In the configuration without the walls 405, the incident angle θ1M is defined by the inclination angle of the nozzle 401A. The linear source 400 can include a plurality of nozzles that eject the organic light-emitting material at the incident angle θ1M.

The nozzle 401B is inclined in the direction YB at the largest inclination angle among the nozzles 401 in the linear source 400. The organic light-emitting material ejected from the nozzle 401B travels toward the mask pattern 532 and the motherboard at a specific diffusion angle. The largest incident angle of the organic light-emitting material ejected from the nozzle 401B on the motherboard is θ1 in the direction YA and θ2M in the direction YB.

The incident angle θ2M is the largest incident angle in the direction YB available from the linear source 400. In this example, the incident angle θ2M is defined by a wall 405. In the configuration without the walls 405, the incident angle θ2M is defined by the inclination angle of the nozzle 401B. The linear source 400 can include a plurality of nozzles that eject the organic light-emitting material at the incident angle θ2M.

In the mask pattern 532, a step height SH is defined. The step height SH is a distance between the nominal opening 541 and the motherboard-side opening 547 along the normal and corresponds to the depth of the motherboard-side hole 546.

In the mask pattern 532, a taper angle θT and a step angle θS are defined. In FIG. 5, the taper angle θT and the step angle θS are indicated at the locations on the opposite sides of the linear-source-side hole 545 and the motherboard-side hole 546 provided with reference signs. The same angles are defined on the linear-source-side hole 545 and the motherboard-side hole 546 indicated in FIG. 5.

The taper angle θT is the taper angle of the linear-source-side hole 545. The taper angle θT is the angle (acute angle) between the line connecting the edge of the linear-source-side opening 543 and the edge of the nominal opening 541 and the Y-axis direction.

The step angle θS is the taper angle of the motherboard-side hole 546. The step angle θS is the angle (acute angle) between the line connecting the edge of the motherboard-side opening 547 and the edge of the nominal opening 541 and the Y-axis direction.

An anode depth AD is defined between the mask pattern 532 and the anode electrode 162. The anode depth AD is the distance between the surface (deposition surface) of the anode electrode 162 and the motherboard-side surface 539 of the mask pattern 532 along the normal. The distance (distance D1) between the surface of the anode electrode 162 and the nominal opening 541 along the normal is the sum of the anode depth AD and the step height SH.

In the example of FIG. 5, the linear-source-side hole 545 and the motherboard-side hole 546 are bilaterally symmetric. Accordingly, the values of the left taper angle θT and the right taper angle θT of the linear-source-side hole 545 are equal. The values of the left step angle θS and the right step angle θS of the motherboard-side hole 546 are also equal. The centers of the anode electrode 162, the motherboard-side opening 547, the nominal opening 541, and the linear-source-side opening 543 are located on the single normal to the motherboard. The shapes of the anode electrode 162 and the pixel defining layer 163 exposed from the nominal opening 541 are bilaterally symmetric.

The incident angle of the organic light-emitting material and the shape of the mask pattern 532 determine the distances S1L, S1R, S2L, and S2R in the area of the motherboard to which the organic light-emitting material adheres. The distances S1L and S2L are the distances on the left of the nominal opening 541 in FIG. 5. The distances S1R and S2R are the distances on the right of the nominal opening 541 in FIG. 5.

The distances S1L and S1R are the distances along the Y-axis between the edge of the nominal opening 541 and the edge of the area of the anode electrode 162 to which the organic light-emitting material adheres uniformly. The distances S2L and S2R are the distances along the Y-axis between the edge of the nominal opening 541 and the edge of the area to which the organic light-emitting material that passes through the nominal opening 541 can adhere. The area to which the organic light-emitting material can adhere are determined with reference to the deposition surface of the anode electrode 162.

The distance S1L on the left is determined by the organic light-emitting material ejected from the nozzle 401B inclined rightward. In the area on the right of the area indicated by the distance S1L, the organic light-emitting material coming from the moving nozzle 401B at any angle adheres to the anode electrode 162. In this example, the adhesion area of the organic light-emitting material is determined by the nominal opening 541, as will be described later. The point where the organic light-emitting material coming from the nozzle 401B adheres immediately before all the organic light-emitting material is blocked by the left edge of the nominal opening 541 defines the distance S1L.

Specifically, the distance S1L is expressed by the following formula (1):

$$S1L=(SH+AD)\times\tan(\theta 2M) \quad (1)$$

The distance S1R on the right is determined by the organic light-emitting material ejected from the nozzle 401A inclined leftward. In the area on the left of the area indicated by the distance S1R, the organic light-emitting material coming from the moving nozzle 401A at any angle adheres to the anode electrode 162. The point where the organic light-emitting material coming from the nozzle 401A adheres immediately before all the organic light-emitting material is blocked by the right edge of the nominal opening 541 defines the distance S1R.

Specifically, the distance S1R is expressed by the following formula (2):

$$S1R=(SH+AD)\times\tan(\theta 1M) \quad (2)$$

The distance S2L on the left is determined by the organic light-emitting material ejected from the nozzle 401A inclined leftward. The left end of the distance S2L is the edge of the area where the organic light-emitting material that is ejected from the nozzle 401A and passes through the nominal opening 541 adheres. The point where the organic light-emitting material coming from the nozzle 401A at the angle θ1M adheres immediately before being blocked by the left edge of the nominal opening 541 defines the distance S2L.

Specifically, the distance S2L is expressed by the following formula (3):

$$S2L=(SH+AD)\times\tan(\theta 1M) \quad (3)$$

The distance S2R on the right is determined by the organic light-emitting material ejected from the nozzle 401B inclined rightward. The right end of the distance S2R is the edge of the area where the organic light-emitting material that is ejected from the nozzle 401B and passes through the nominal opening 541 adheres. The point where the organic light-emitting material coming from the nozzle 401B at the angle θ2M adheres immediately before being blocked by the right edge of the nominal opening 541 defines the distance S2R.

Specifically, the distance S2R is expressed by the following formula (4):

$$S2R=(SH+AD)\times\tan(\theta 2M) \quad (4)$$

The above formulae (1) to (4) indicate S1L=S2R and S2L=S1R. If the maximum incident angle θ1M in the direction YA is equal to the maximum incident angle θ2M in the direction YB, S1L=S1R=S2L=S2R.

Hereinafter, the requirements to be satisfied by the foregoing numerical values about the metal mask 503 (mask pattern 532) are described. For deposition of an organic light-emitting material, highly precise deposition point control is required. Accordingly, it is important that the deposition area of the organic light-emitting material on the motherboard is affected by neither the linear-source-side opening 543 nor the motherboard-side opening 547 of the mask pattern 532 but is controlled by the nominal opening 541. Forming the nominal opening 541 at high precision enables highly precise control of the deposition area of the organic light-emitting material.

To control the deposition area of the organic light-emitting material only with the nominal opening 541, the taper angle θT and the step angle θS need to satisfy specific relations with the maximum incident angle θ1M and θ2M of the organic light-emitting material.

Specifically, the taper angle θT needs to satisfy the following relations (5) and (6):

$$\theta T<90-\theta 1M \quad (5)$$

$$\theta T<90-\theta 2M \quad (6)$$

Satisfaction of the relations (5) and (6) can make the distances S1L, S2L, S1R, and S2R independent from the taper angle θT. The relations (5) and (6) can be expressed as the following relation (7):

$$\theta T<90-\max(\theta 1M,\theta 2M) \quad (7)$$

where max(θ1M, θ2M) is the larger value between θ1M and θ2M.

If the relation (7) is satisfied, the organic light-emitting material from the moving linear source 400 first passes through the linear-source-side opening 543 and is blocked by the masking part (bridge) without passing through the nominal opening 541. When the linear source 400 moves further, the organic light-emitting material passes through the nominal opening 541. This phenomenon applies to the movement in both directions YA and YB.

If the relation (7) is not satisfied, particularly the distance S1L or the distance S1R is defined by the linear-source-side opening 543. Satisfaction of the relation (7) enables the uniform deposition area on the anode electrode 162 to be defined by the nominal opening 541 with high precision.

The step angle θS needs to satisfy the following relations (8) and (9):

$$\theta S < 90 - \theta 1M \quad (8)$$

$$\theta S < 90 - \theta 2M \quad (9)$$

Satisfaction of the relations (8) and (9) can make the distances S1L, S2L, S1R, and S2R independent from the step angle θS. The relations (8) and (9) can be expressed as the following relation (10):

$$\theta S < 90 - \max(\theta 1M, \theta 2M) \quad (10)$$

If the relation (10) is satisfied, all the organic light-emitting material that passes the nominal opening 541 passes through the motherboard-side opening 547. The organic light-emitting material is not blocked by the edge of the motherboard-side opening 547.

If the relation (10) is not satisfied, particularly the distance S2L or the distance S2R is defined by the motherboard-side opening 547. Satisfaction of the relation (10) enables the edge of the deposition area to be defined by the nominal opening 541 with high precision.

Designing an OLED display device requires that the distances S1L, S2L, S1R, and S2R in the fabricated OLED display device are within specified ranges. Specifically, the permissible maximum values S1LM, S2LM, S1RM, and S2RM are defined for the distances S1L, S2L, S1R, and S2R, respectively. For example, the permissible maximum values S1LM and S1RM are the distances along the Y-axis between the edge of the nominal opening 541 and the edge of the exposed surface of the anode electrode 162. The permissible maximum values S2LM and S2RM are the distances along the Y-axis between the edge of the nominal opening 541 and the edge of the exposed surface of the adjacent sub-pixel electrode (for example, the anode electrode 162L2 or 162R2) which is adjacent to the anode electrode 162.

The permissible maximum values S1LM and S1RM achieve the light emission characteristics required for each sub-pixel. The permissible maximum values S2LM and S2RM prevent color mixture caused by mixing the organic light-emitting material for a specific sub-pixel into the adjacent sub-pixels.

In view of the foregoing, the following relations (11) to (14) are to be satisfied.

$$S1LM > S1L = (SH + AD) \times \tan(\theta 2M) \quad (11)$$

$$S1RM > S1R = (SH + AD) \times \tan(\theta 1M) \quad (12)$$

$$S2LM > S2L = (SH + AD) \times \tan(\theta 1M) \quad (13)$$

$$S2RM > S2R = (SH + AD) \times \tan(\theta 2M) \quad (14)$$

Representing max(S1LM, S1RM) as S1M (SY), max (S2LM, S2RM) as S2M (SX), and max (θ1M, θ2M) as θM, the relations (11) and (12) are expressed as the following relation (15) and the relations (13) and (14) are expressed as the following relation (16):

$$S1M > (SH + AD) \times \tan(\theta M) \quad (15)$$

$$S2M > (SH + AD) \times \tan(\theta M) \quad (16)$$

In the example of FIG. 6, satisfying the relation (16) prevents the organic light-emitting material for the first color of the first sub-pixel including the anode electrode 162 from being vapor deposited on the adjacent anode electrode (for example, the anode electrode 162L2) included in the second sub-pixel adjacent to the first sub-pixel. As a result, color mixture can be prevented. Note that the second sub-pixel is a sub-pixel for the second color and it is preferable to deposit the organic light-emitting material for the second color on the adjacent anode electrode without depositing the organic light-emitting material for the first color.

The organic light-emitting material deposition step as one of the steps of manufacturing the OLED display device 10 is performed under the conditions satisfying the relations (5) and (6). Furthermore, the deposition step is performed under the conditions satisfying the relations (11) to (14) or the relations (15) and (16). Unless the requirement for the uniformity of the organic light-emitting film on the anode electrode 162 is strict, satisfaction of the relations (11) and (12) (or the relation (15)) can be optional for the manufacturing conditions, depending on the design.

In similar, the metal mask 503 has (is formed to have) the structure satisfying the relations (5) and (6). Furthermore, the metal mask 503 has (is formed to have) the structure satisfying the relations (11) to (14) or the relations (15) and (16). For the metal mask 503, S1LM, S1RM, S2LM, S2RM, AD, θ1M, and θ2M are given values.

The step angle θS of the metal mask 503 satisfies the relation (5) and (6) and the step height SH satisfies the relations (15) and (16). The metal mask 503 is formed to satisfy these conditions. As described above, the condition of the relation (15) can be optional depending on the design.

Figure 7:
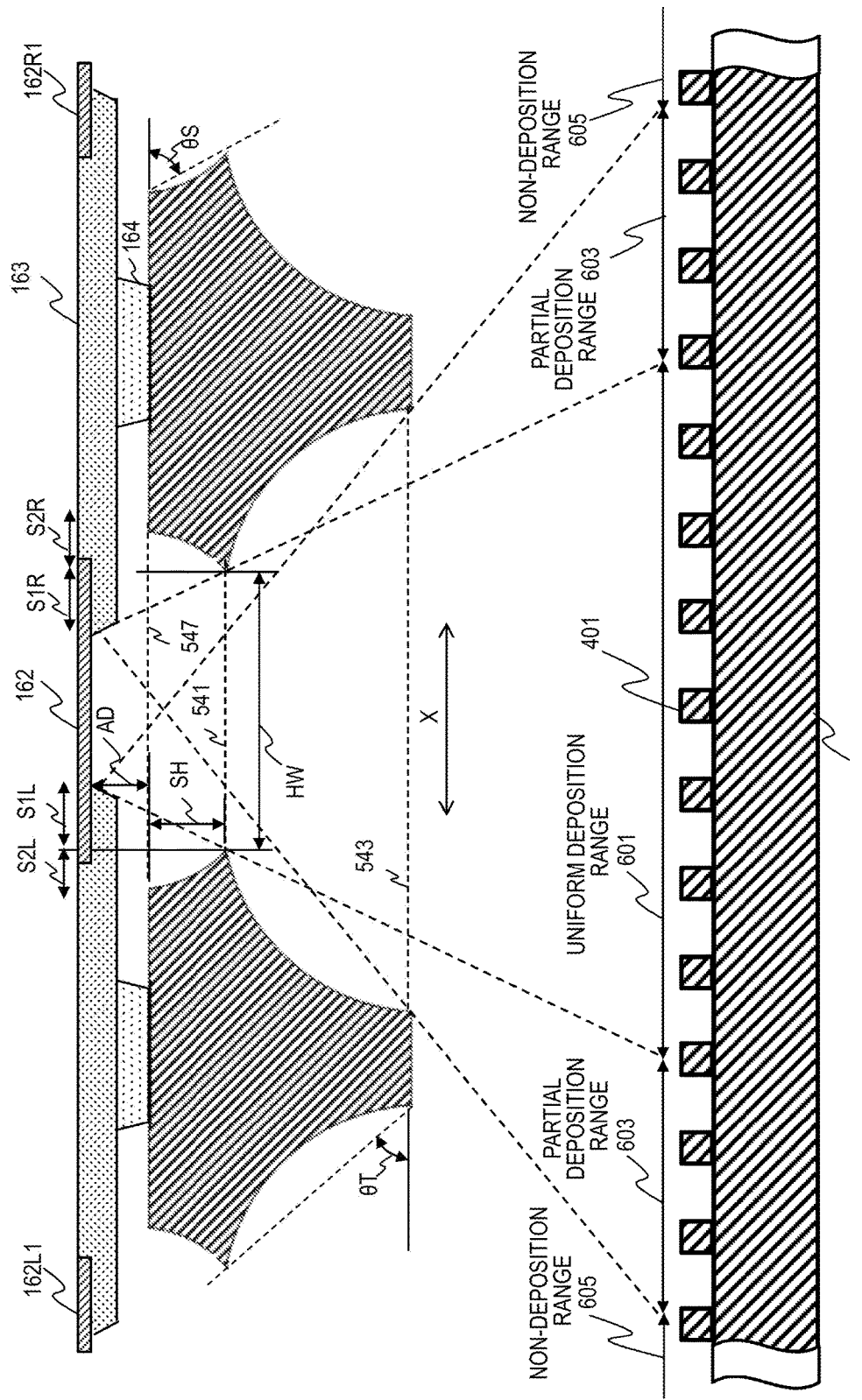
FIG. 7 schematically illustrates a relation of a linear source, a mask pattern, and a motherboard.

FIGS. 7 and 8 schematically illustrate the relation of the linear source 400, the mask pattern 532, and the motherboard. FIGS. 7 and 8 provide a cross-section along the X-axis perpendicular to the direction of movement of the linear source 400 (the Y-axis direction) and correspond to FIGS. 5 and 6, respectively.

The taper angle θT and the step angle θS may be equal to or different from those in the Y-axis direction shown in FIG. 5. The same applies to the distances S1L, S1R, S2L, and S2R. In the X-axis direction, the smaller the taper angle θT, the less the organic light-emitting material to be blocked. However, since the organic light-emitting material ejected from the nozzle 401 has a specific diffusion angle about the perpendicular direction, the taper angle θT does not need to be smaller than necessary.

As illustrated in FIGS. 7 and 8, a plurality of nozzles 401 are disposed along the X-axis. From the viewpoint of deposition of the organic light-emitting material onto a single sub-pixel, the area where the nozzles 401 are disposed is separated into a plurality of sections depending on the taper angle.

Specifically, the nozzle disposition area is separated to one uniform deposition range 601, two partial deposition ranges 603, and two non-deposition ranges 605. The uniform deposition range 601 is sandwiched between the two partial deposition ranges 603; the two partial deposition ranges 603 are sandwiched between the two non-deposition ranges 605.

All the organic light-emitting material ejected from the nozzles 401 in the uniform deposition range 601 adheres to the area of the substrate where uniform deposition is required. As to the organic light-emitting material ejected from the nozzles 401 in the partial deposition ranges 603, only part of it adheres to the area of the substrate where uniform deposition is required. The organic light-emitting material ejected from the nozzles 401 in the non-deposition ranges 605 does not adhere to the area of the substrate where uniform deposition is required.

Hereinafter, a designing method and a manufacturing method in consideration of errors in manufacturing are described. It is difficult to perform the processes such as manufacturing the metal mask 503, assembling the metal mask module 500, and positioning the metal mask 500 onto the motherboard without error in each of the processes at any time.

For this reason, in designing the metal mask 503 and for the deposition process using the metal mask 503, process margins for manufacturing the OLED display device 10 are defined in advance. Considering the process margins in designing and manufacturing enables the organic light-emitting material to be more unfailingly vapor deposited on the desired area of the motherboard through the metal mask 503.

The variations to be considered about the metal mask 503 are the variation in pitch of the openings, the variation in size of the openings, and the variation in alignment. Considering the total variation inclusive of all these variations in designing the manufacturing system for the metal mask 503 and the OLED display device 10 enables the organic light-emitting material to be more unfailingly vapor deposited on the desired area of the motherboard through the metal mask 503.

In designing the metal mask 503, the rated variation $\Delta Tp$ for the pitch of openings, the rated variation $\Delta Cd$ for the size of openings, and the rated variation $\Delta Ae$ for the alignment are predetermined. The metal mask 503 is designed to satisfy the predetermined conditions including the total variation of these variations.

Figure 9A:
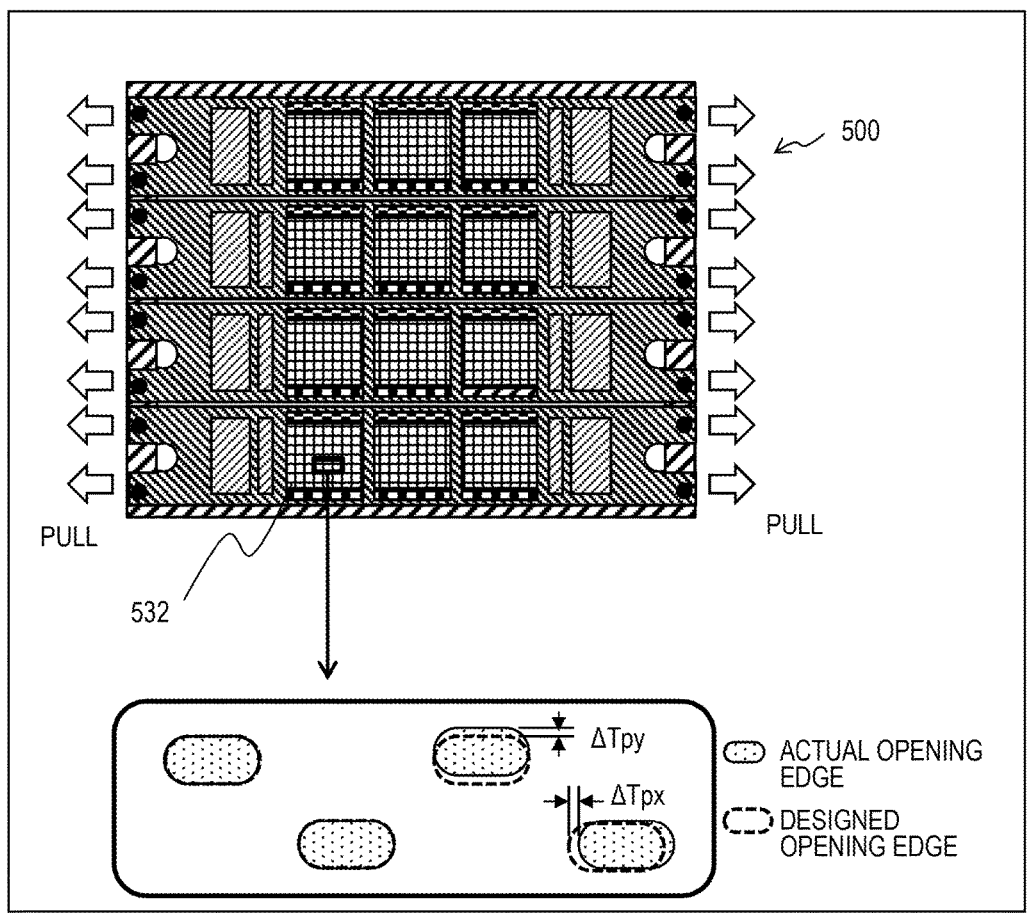
FIG. 9A is a diagram for illustrating a rated variation $\Delta Tp$ for the pitch of openings.

FIG. 9A is a diagram for illustrating the rated variation $\Delta Tp$ for the pitch of the openings. The rated variation $\Delta Tp$ for the pitch of the openings is the variation (the design value thereof) of the actual value from the design value of the pitch of the openings in the metal mask module 500. There are a rated variation $\Delta Tpx$ along the X-axis for the pitch of the openings and a rated variation $\Delta Tpy$ along the Y-axis for the pitch of the openings. This embodiment particularly considers the rated variation $\Delta Tpy$ along the Y-axis for the pitch of the openings in designing the mask.

Figure 9B:
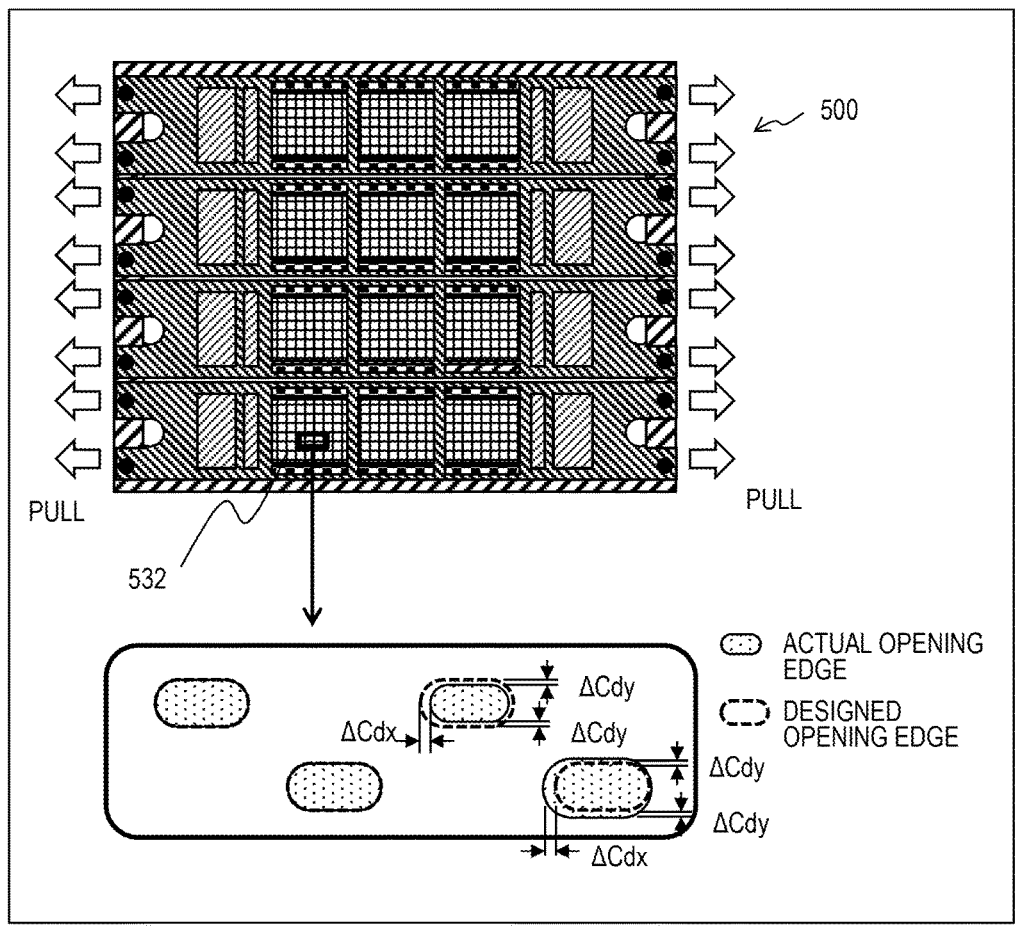
FIG. 9B is a diagram for illustrating a rated variation $\Delta Cd$ for the size of openings.

FIG. 9B is a diagram for illustrating the rated variation $\Delta Cd$ for the size of the openings. The rated variation $\Delta Cd$ for the size of the openings is the variation (the design value thereof) of the actual value from the design value of the size of the openings in the metal mask module 500. There are a rated variation $\Delta Cdx$ along the X-axis for the size of the openings and a rated variation $\Delta Cdy$ along the Y-axis for the size of the openings. This embodiment particularly considers the rated variation $\Delta Cdy$ along the Y-axis for the size of the openings in designing the mask.

Figure 9C:
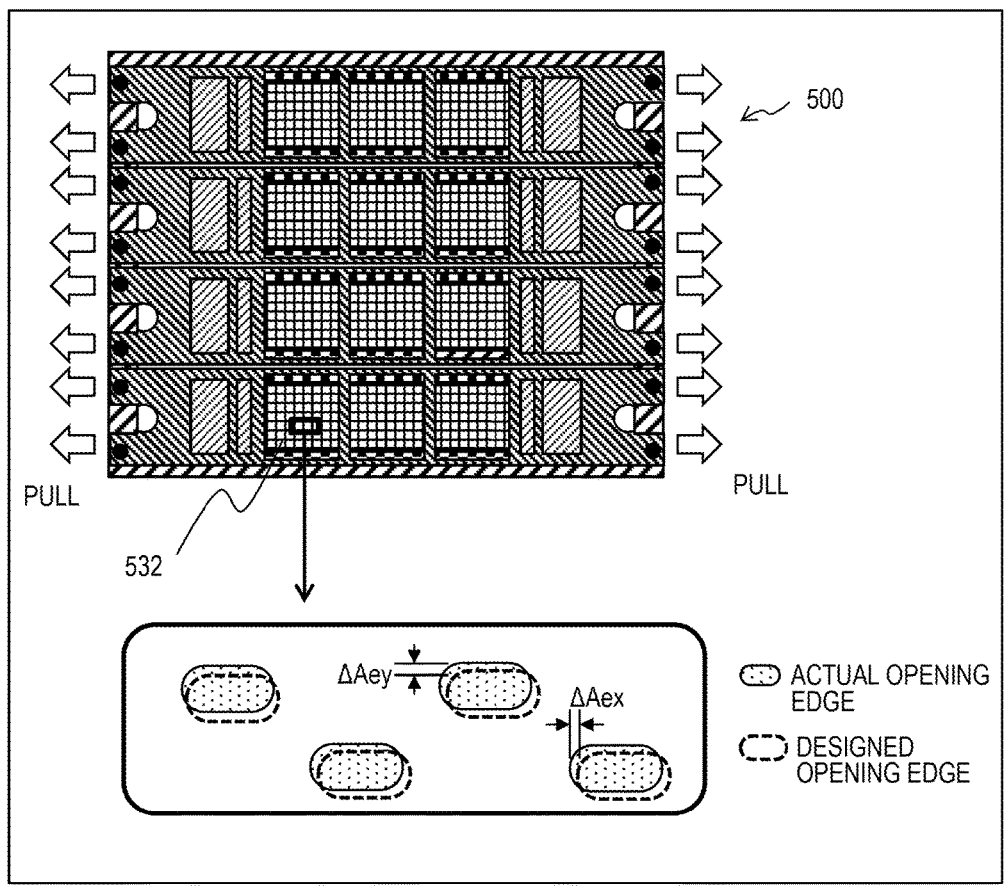
FIG. 9C is a diagram for illustrating a rated variation $\Delta Ae$ for the alignment.

FIG. 9C is a diagram for illustrating the rated variation $\Delta Ae$ for the alignment. The rated variation $\Delta Ae$ for the alignment is the variation (the design value thereof) of the actual value from the design value in positioning the mask pattern 532 onto the motherboard. There are a rated variation $\Delta Aex$ along the X-axis for the alignment and a rated variation $\Delta Aey$ along the Y-axis for the alignment. This embodiment particularly considers the rated variation $\Delta Aey$ along the Y-axis for the alignment in designing the mask. The metal mask 503 is designed to satisfy the following relations (17) to (20) or the following relations (21) and (22) in addition to the aforementioned relations (7) and (10).

$$S1LM > S1L = (SH+AD) \times \tan(\theta 2M) + (\theta Tp^2 + \Delta Cd^2 + \Delta Ae^2)^{1/2} \tag{17}$$

$$S1RM > S1R = (SH+AD) \times \tan(\theta 1M) + (\Delta Tp^2 + \Delta Cd^2 + \Delta Ae^2)^{1/2} \tag{18}$$

$$S2LM > S2L = (SH+AD) \times \tan(\theta 1M) + (\Delta Tp^2 + \Delta Cd^2 + \Delta Ae^2)^{1/2} \tag{19}$$

$$S2RM > S2R = (SH+AD) \times \tan(\theta 2M) + (\Delta Tp^2 + \Delta Cd^2 + \Delta Ae^2)^{1/2} \tag{20}$$

$$S1M > (SH+AD) \times \tan(\theta M) + (\Delta Tp^2 + \Delta Cd^2 + \Delta Ae^2)^{1/2} \tag{21}$$

$$S2M > (SH+AD) \times \tan(\theta M) + (\Delta Tp^2 + \Delta Cd^2 + \Delta Ae^2)^{1/2} \tag{22}$$

In designing a metal mask, the values except for the step height SH in the foregoing relations are given values. Manufacturing the OLED display device 10 deposits the organic light-emitting material onto the motherboard using the metal mask 503 designed in accordance with the above-described conditions.

As set forth above, an embodiment of this invention has been described; however, this invention is not limited to the foregoing embodiment. Those skilled in the art can easily modify, add, or convert each element in the foregoing embodiment within the scope of this invention. A part of the configuration of one embodiment may be replaced with a configuration of another embodiment or a configuration of an embodiment may be incorporated into a configuration of another embodiment.

What is claimed is:

1. A method of manufacturing an OLED display device comprising:

depositing an organic light-emitting material onto an electrode surface of a substrate through a mask while moving a linear source having a plurality of nozzles in a first direction, wherein the mask has a plurality of holes in a surface facing the linear source, wherein each of the plurality of holes has a first opening and a second opening larger than the first opening and the second opening is located between the first opening and the linear source, and wherein relations of $\theta T < 90 - \theta M$ and $SX > D1 \times \tan \theta M$ are satisfied, where D1 is a distance from the first opening to the electrode surface, $\theta M$ is the largest incident angle in the first direction of the organic light-emitting material, SX is a distance in the first direction from an edge of the first opening to an edge of an adjacent sub-pixel electrode, and $\theta T$ is a taper angle defined by a line connecting the edge of the first opening and the edge of the second opening and the first direction.

2. The manufacturing method according to claim 1, wherein the mask has a plurality of second holes stacked on the plurality of holes in the reverse surface of the surface facing the linear source, wherein each of the plurality of second holes has a third opening larger than the first opening and the third opening is located between the first opening and the substrate, and wherein a relation of $\theta S < 90 - \theta M$ is satisfied, where $\theta S$ is a step angle defined by a line connecting the edge of the first opening and an edge of the third opening and the first direction.

3. The manufacturing method according to claim 2, wherein a relation of $SY > D1 \times \tan \theta M$ is satisfied, where SY is a distance from the edge of the first opening to an edge of the electrode surface exposed from the first opening.

4. The manufacturing method according to claim 2,
wherein a rated variation $\Delta Tp$ for pitch of the first openings, a rated variation $\Delta Cd$ for size of the first openings, and a rated variation $\Delta Ae$ for alignment are predefined, and
wherein a relation of $SX > D1 \times \tan(\theta M) + (\Delta Tp^2 + \Delta Cd^2 + \Delta Ae^2)^{1/2}$ is satisfied.

5. The manufacturing method according to claim 1, wherein a relation of $SY > D1 \times \tan \theta M$ is satisfied, where SY is a distance from the edge of the first opening to an edge of the electrode surface exposed from the first opening.

6. The manufacturing method according to claim 5,
wherein a rated variation $\Delta Tp$ for pitch of the first openings, a rated variation $\Delta Cd$ for size of the first openings, and a rated variation $\Delta Ae$ for alignment are predefined, and
wherein a relation of $SX > D1 \times \tan(\theta M) + (\Delta Tp^2 + \Delta Cd^2 + \Delta Ae^2)^{1/2}$ is satisfied.

7. The manufacturing method according to claim 1,
wherein a rated variation $\Delta Tp$ for pitch of the first openings, a rated variation $\Delta Cd$ for size of the first openings, and a rated variation $\Delta Ae$ for alignment are predefined, and
wherein a relation of $SX > D1 \times \tan(\theta M) + (\Delta Tp^2 + \Delta Cd^2 + \Delta Ae^2)^{1/2}$ is satisfied.

8. The manufacturing method according to claim 7, wherein a relation of $SY > D1 \times \tan(\theta M) + (\Delta Tp^2 + \Delta Cd^2 + \Delta Ae^2)^{1/2}$ is satisfied.

9. The manufacturing method according to claim 1,
wherein the organic light-emitting material is an organic light-emitting material for a first color, and
wherein an organic light-emitting material for a second color is vapor deposited onto the adjacent sub-pixel electrode.

10. A mask to be placed between an electrode surface of a substrate and a linear source including a plurality of nozzles and being configured to move in a first direction for deposition of an organic light-emitting material onto the electrode surface, the mask comprising:
a surface to face the linear source, the surface having a plurality of holes,
wherein each of the plurality of holes has a first opening and a second opening larger than the first opening and the second opening is to be located between the first opening and the linear source, and
wherein relations of $\theta T < 90 - \theta M$ and $SX > D1 \times \tan \theta M$ are satisfied, where
D1 is a distance between the first opening and the electrode surface,
$\theta M$ is the largest incident angle in the first direction of the organic light-emitting material,
SX is a distance in the first direction from an edge of the first opening to an edge of an adjacent sub-pixel electrode, and
$\theta T$ is a taper angle defined by a line connecting the edge of the first opening and the edge of the second opening and the first direction.

11. The mask according to claim 10, further comprising another surface having a plurality of second holes stacked on the plurality of holes on the reverse side of the surface to face the linear source,
wherein each of the plurality of second holes has a third opening larger than the first opening and the third opening is to be located between the first opening and the substrate, and
wherein a relation of $\theta S < 90 - \theta M$ is satisfied, where $\theta S$ is a step angle defined by a line connecting the edge of the first opening and an edge of the third opening and the first direction.

12. The mask according to claim 11, wherein a relation of $SY > D1 \times \tan \theta M$ is satisfied, where SY is a distance from the edge of the first opening to an edge of the electrode surface exposed from the first opening.

13. The mask according to claim 12,
wherein a rated variation $\Delta Tp$ for pitch of the first openings, a rated variation $\Delta Cd$ for size of the first openings, and a rated variation $\Delta Ae$ for alignment are predefined, and
wherein a relation of $SX > D1 \times \tan(\theta M) + (\Delta Tp^2 + \Delta Cd^2 + \Delta Ae^2)^{1/2}$ is satisfied.

14. The mask according to claim 11,
wherein a rated variation $\Delta Tp$ for pitch of the first openings, a rated variation $\Delta Cd$ for size of the first openings, and a rated variation $\Delta Ae$ for alignment are predefined, and
wherein a relation of $SX > D1 \times \tan(\theta M) + (\Delta Tp^2 + \Delta Cd^2 + \Delta Ae^2)^{1/2}$ is satisfied.

15. The mask according to claim 10, wherein a relation of $SY > D1 \times \tan \theta M$ is satisfied, where SY is a distance from the edge of the first opening to an edge of the electrode surface exposed from the first opening.

16. The mask according to claim 15,
wherein a rated variation $\Delta Tp$ for pitch of the first openings, a rated variation $\Delta Cd$ for size of the first openings, and a rated variation $\Delta Ae$ for alignment are predefined, and
wherein a relation of $SX > D1 \times \tan(\theta M) + (\Delta Tp^2 + \Delta Cd^2 + \Delta Ae^2)^{1/2}$ is satisfied.

17. The mask according to claim 10,
wherein a rated variation $\Delta Tp$ for pitch of the first openings, a rated variation $\Delta Cd$ for size of the first openings, and a rated variation $\Delta Ae$ for alignment are predefined, and
wherein a relation of $SX > D1 \times \tan(\theta M) + (\Delta Tp^2 + \Delta Cd^2 + \Delta Ae^2)^{1/2}$ is satisfied.

18. The mask according to claim 17, wherein a relation of $SY > D1 \times \tan(\theta M) + (\Delta Tp^2 + \Delta Cd^2 + \Delta Ae^2)^{1/2}$ is satisfied.

19. A method of designing a mask to be placed between a linear source and an electrode surface of a substrate for deposition of an organic light-emitting material onto the electrode surface,
the linear source including a plurality of nozzles and being configured to move in a first direction,
the mask having a plurality of holes in a surface to face the linear source,
each of the plurality of holes having a first opening and a second opening larger than the first opening, the second opening being to be located between the first opening and the linear source, and
the designing method comprising:
predefining values of a largest incident angle $\theta M$ in the first direction of the organic light-emitting material and a distance SX in the first direction from an edge of the first opening to an edge of an electrode of an adjacent sub-pixel; and
determining values for a distance D1 between the first opening and the electrode surface and a taper angle $\theta T$ defined by a line connecting the edge of the first opening and the edge of the second opening and the first direction in such a manner that relations of $\theta T < 90 - \theta M$ and $SX > D1 \times \tan \theta M$ are satisfied.

20. The designing method according to claim 19, further comprising:
predefining values of a rated distance SY from an edge of the first opening to an edge of the electrode surface exposed from the first opening; and
determining a value for the distance D1 from the first opening to the electrode surface in such a manner that a relation of SY>D1×tan θM is satisfied.

* * * * *